(12) United States Patent
Etemadi et al.

(10) Patent No.: US 8,594,251 B2
(45) Date of Patent: Nov. 26, 2013

(54) LONG-TERM DRIFT MITIGATION FOR RADIO FREQUENCY RECEIVERS UTILIZING A FREE-RUNNING CRYSTAL

(75) Inventors: Farzad Etemadi, Laguna Niguel, CA (US); Massoud Kahrizi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 177 days.

(21) Appl. No.: 13/166,519

(22) Filed: Jun. 22, 2011

(65) Prior Publication Data

US 2012/0328058 A1  Dec. 27, 2012

(51) Int. Cl.
*H04L 27/06* (2006.01)

(52) U.S. Cl.
USPC ........... 375/344; 375/346; 375/347; 375/326; 375/327; 375/147

(58) Field of Classification Search
USPC ......... 375/344, 320, 136, 147, 327, 337, 375, 375/376, 326, 346, 371
See application file for complete search history.

(56) References Cited

U.S. PATENT DOCUMENTS

| 4,951,237 | A | 8/1990 | Essenwanger |
| 5,287,388 | A | 2/1994 | Ogura et al. |
| 6,400,778 | B1 | 6/2002 | Matui |
| 7,352,831 | B2* | 4/2008 | Quinlan et al. ............... 375/344 |
| 7,881,692 | B2* | 2/2011 | Tuttle et al. .................. 455/333 |
| 8,060,049 | B2* | 11/2011 | Tuttle et al. .................. 455/333 |
| 8,204,154 | B2 | 6/2012 | Min et al. |
| 2006/0128347 | A1* | 6/2006 | Piriyapoksombut et al. . 455/333 |
| 2012/0328052 | A1 | 12/2012 | Etemadi et al. |

* cited by examiner

*Primary Examiner* — Qutbuddin Ghulamali
(74) *Attorney, Agent, or Firm* — Sterne, Kessler, Goldstein & Fox P.L.L.C.

(57) ABSTRACT

Embodiments of a receiver for using a first oscillator signal provided by a crystal resonator to support multiple, different functionalities are provided. The receiver comprises a phase-locked loop (PLL) configured to provide a second oscillator signal based on the first oscillator signal provided by the crystal resonator; a first mixer configured to mix a received signal received over a first input path with the second oscillator signal received over a second input path to provide a first frequency-shifted signal; and an automatic frequency controller (AFC) configured to estimate a frequency offset of the second oscillator signal and adjust the PLL to compensate for the frequency offset. The receiver further can include solutions for mitigating potential sources of noise caused by the frequency of the first oscillator signal not being compensated for by the AFC.

20 Claims, 6 Drawing Sheets

LONG-TERM DRIFT MITIGATION FOR RADIO FREQUENCY RECEIVERS UTILIZING A FREE-RUNNING CRYSTAL

FIELD OF THE INVENTION

This application relates generally to receivers and more particularly to radio frequency (RF) receivers that use crystal resonators.

BACKGROUND

There exist two commonly implemented front-end architectures in radio frequency (RF) receiver design; namely, the homodyne architecture and the superheterodyne architecture. The homodyne architecture down-converts a desired carrier (or channel) in a received signal directly from RF to baseband, whereas the superheterodyne architecture down-converts a desired carrier (or channel) in a received signal to one or more intermediate frequencies (IFs) before down-conversion to baseband. In general, each of these front-end architectures typically employ an antenna to receive a signal, a low noise amplifier (LNA) to provide gain to the signal, and one or more down-conversion and filtering stages.

In both front-end architectures, the down-conversion stage(s) include a mixer for mixing the received signal with a local oscillator (LO) signal to down-convert the desired carrier in the received signal to baseband or some non-zero IF for further processing. The LO signal in the homodyne architecture is ideally tuned to have a frequency identical to the desired carrier such that the carrier is down-converted to baseband. The LO signal in the superheterodyne architecture (or at least one LO signal in the superheterodyne architecture), on the other hand, is ideally tuned to have a frequency that is offset from the frequency of the desired carrier by an amount equal to the chosen IF such that the carrier is down-converted to the IF.

There is often a small frequency error (or offset), however, in the LO signal from its ideal frequency. This error causes the desired carrier to be down-converted to a frequency position other than what is expected (i.e., to a frequency position other than at baseband in a homodyne architecture and to a frequency position other than at the chosen IF in the superheterodyne architecture). Proper recovery of the information modulated onto the desired carrier generally requires that the carrier be down-converted (very close) to the expected frequency location.

Therefore, automatic frequency correction is often employed at the receiver to estimate and compensate for any frequency error in the LO signal, such that the desired carrier is down-converted (very close) to its expected frequency position (i.e., very close to baseband in a homodyne architecture and very close to the chosen IF in the superheterodyne architecture). FIG. 1 illustrates a conventional homodyne receiver 100 that performs automatic frequency correction. As illustrated in FIG. 1, conventional homodyne receiver 100 includes a front-end 105 for performing amplification, down-conversion, and filtering, and a baseband processing section 110 for performing decoding or demapping.

Front-end 105 specifically includes an antenna 115, a low-noise amplifier (LNA) 120, a mixer 125, a phase-locked loop (PLL) 130, a digitally controlled crystal oscillator (DCXO) 135, a crystal resonator 140, a low-pass filter 145, an analog-to-digital converter (ADC) 150, and a digital signal processor (DSP) 155. In operation, antenna 115 is configured to receive an RF signal that includes a desired carrier. The desired carrier can be positioned within a frequency band defined by a particular communications standard. For example, the desired carrier can be positioned within a frequency band defined by the Global System for Mobile Communications (GSM) standard.

After being received, the RF signal is provided to LNA 120, which provides sufficient amplification to the RF signal to overcome the noise of subsequent stages in front-end 105, for example. The amplified RF signal is then mixed by mixer 125 with a LO signal provided by PLL 130. PLL 130 provides the LO signal based on a reference oscillator signal provided by DCXO 135 and crystal resonator 140 (i.e., PLL 130 provides the LO signal as some multiple or fractional multiple of the reference oscillator signal). The LO signal is ideally controlled by PLL 130 to have a frequency equal to the desired carrier such that the mixing operation, performed by mixer 125, results in the carrier being down-converted to baseband. The down-converted signal is then filtered by low-pass filter 145 to remove unwanted frequency components, converted to a digital signal (i.e., a sequence of discrete values) by ADC 150, and processed by DSP 155.

Baseband processing section 110 receives the down-converted and filtered signal from DSP 155 and performs further processing. As illustrated in FIG. 1, baseband processing section 110 includes baseband processor 160 and an automatic frequency controller (AFC) 165. Baseband processor 160 is configured to perform decoding or demapping to recover information transmitted over the carrier. AFC 165 is configured to estimate and compensate for any frequency error in the LO signal provided by PLL 130, such that the desired carrier is down-converted (very close) to its expected frequency position (i.e., very close to baseband in the homodyne architecture illustrated in FIG. 1).

AFC 165 can estimate the frequency error using, for example, the down-converted carrier or the information recovered from the carrier by baseband processor 160. The estimated frequency error can then be used by AFC 165 to adjust a frequency at which crystal resonator 140 oscillates and, thereby, the frequency of the reference oscillator signal. Specifically, AFC 165 can adjust the frequency at which crystal resonator 140 oscillates using DCXO 135. For example, DCXO 135 can include a tunable capacitor coupled in parallel (or series) with crystal resonator 140. In general, adding and removing capacitance across a crystal resonator, such as crystal resonator 140, will respectively cause the resonance of the crystal resonator to shift upward and downward.

As noted above, the reference oscillator signal provided by DCXO 135 and crystal resonator 140 is used by PLL 130 as a reference signal to generate the LO signal used by mixer 125. Thus, the frequency of the reference oscillator signal provided by DCXO 135 and crystal resonator 140 can be adjusted by AFC 165 to compensate for the estimated frequency error in the LO signal provided by PLL 130.

Although adjusting the frequency of the reference oscillator signal presents a viable solution for reducing the frequency error in the LO signal provided by PLL 130, this solution has drawbacks. One notable drawback is that the reference oscillator signal provided by DCXO 135 and crystal resonator 140 potentially can no longer serve as a reference clock for other functionalities supported by the device containing homodyne receiver 100. For example, many communication devices, such as cellular phones, provide support for wireless local area network (WLAN) and Global Positioning System (GPS) functionalities in addition to cellular communication functionalities. Even though the reference oscillator signal of a single crystal resonator, such as crystal resonator 140, can be used to support each of these additional functionalities, the sudden changes in frequency of the reference oscillator signal that are caused by AFC 165 to support one functionality are not acceptable to many of the other functionalities, such as GPS.

Therefore, what is needed is a system and method for performing automatic frequency correction in a receiver without adjusting the resonance of the crystal resonator.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. Exemplary Operating Environment

Figure 1:
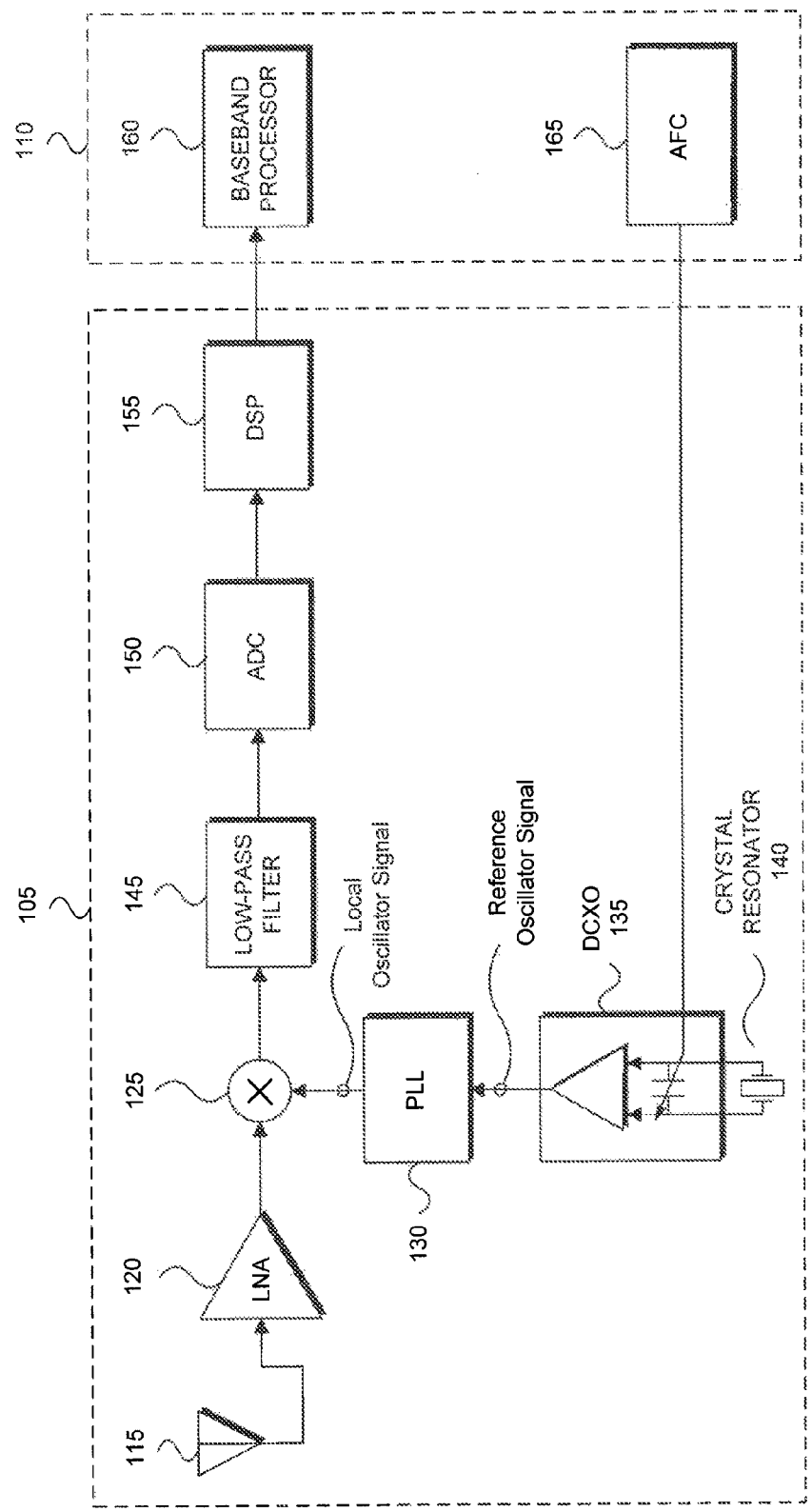
FIG. 1 illustrates a conventional homodyne receiver that performs automatic frequency correction.
Figure 2:
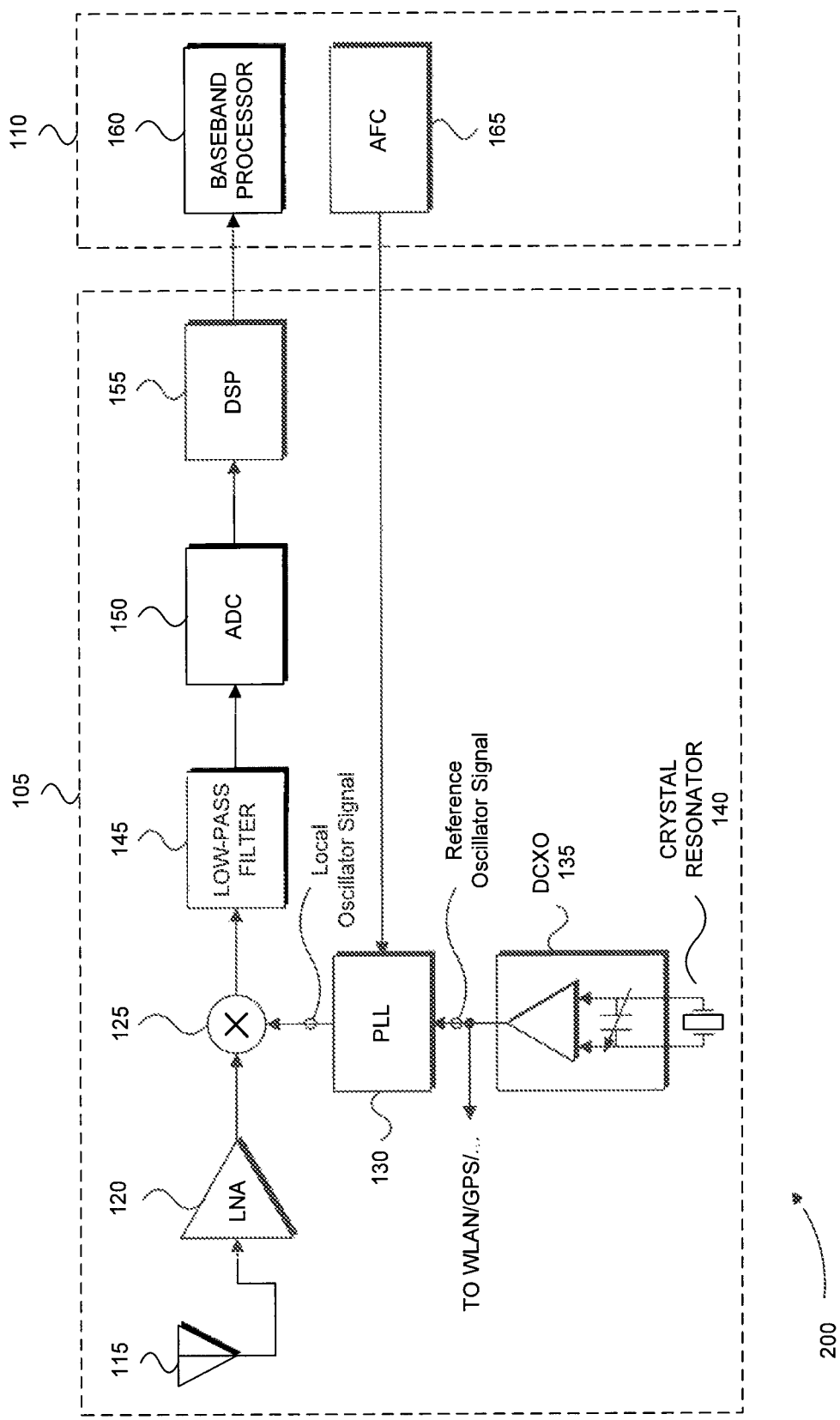
FIG. 2 illustrates a homodyne receiver that performs automatic frequency correction, according to embodiments of the present invention.

FIG. 2 illustrates an exemplary operating environment in which features of the present invention can be implemented. FIG. 2 specifically illustrates an exemplary homodyne receiver 200 with nearly the same configuration as homodyne receiver 100, illustrated in FIG. 1. However, in homodyne receiver 200, the resonance of crystal resonator 140 is not being adjusted by AFC 165. Rather, AFC 165 is configured to adjust PLL 130 to correct for any estimated frequency error in the LO signal produced by PLL 130.

Because AFC 165 is no longer adjusting the resonance of crystal resonator 140, the reference oscillator signal produced by DCXO 135 and crystal resonator 140 in FIG. 2 is not locked to any particular carrier in the received signal and can be said to be free-running. The reference oscillator signal can therefore serve as a reference clock to support multiple, different functionalities of the device containing receiver 200 (even those functionalities that are sensitive to sudden changes in the reference oscillator signal). For example, such functionalities can include cellular communications, Bluetooth, GPS, and WLAN to name a few.

In one embodiment, PLL 130 includes a variable frequency oscillator and a phase detector (not shown). Using the phase detector, PLL 130 compares the phase of the reference oscillator signal with the phase of a divided down version of the output signal from its variable frequency oscillator, which is divided down in frequency according to some divider ratio. The signal from the phase detector is then used to control the variable frequency oscillator to keep the phases matched. The output of the variable frequency oscillator can be used as the LO signal and its frequency can be controlled to be some multiple (or fractional multiple) of the reference oscillator signal by adjusting the divider ratio. In one embodiment, AFC 165 can adjust this divider ratio of PLL 130 to compensate for any estimated frequency error in the LO signal.

The receiver architecture in FIG. 2 allows the reference oscillator signal produced by DCXO 135 and crystal resonator 140 to be used as a reference clock to support multiple different functionalities of the device containing homodyne receiver 200. However, the reference oscillator signal is now no longer compensated and locked to the frequency of the desired carrier, and therefore can produce several challenging sources of noise to homodyne receiver 200. These challenging sources of noise include in-band spurs and long-term drift and they are described further below together with potential solutions for mitigating them.

2. In-Band Spurs

Figure 3:
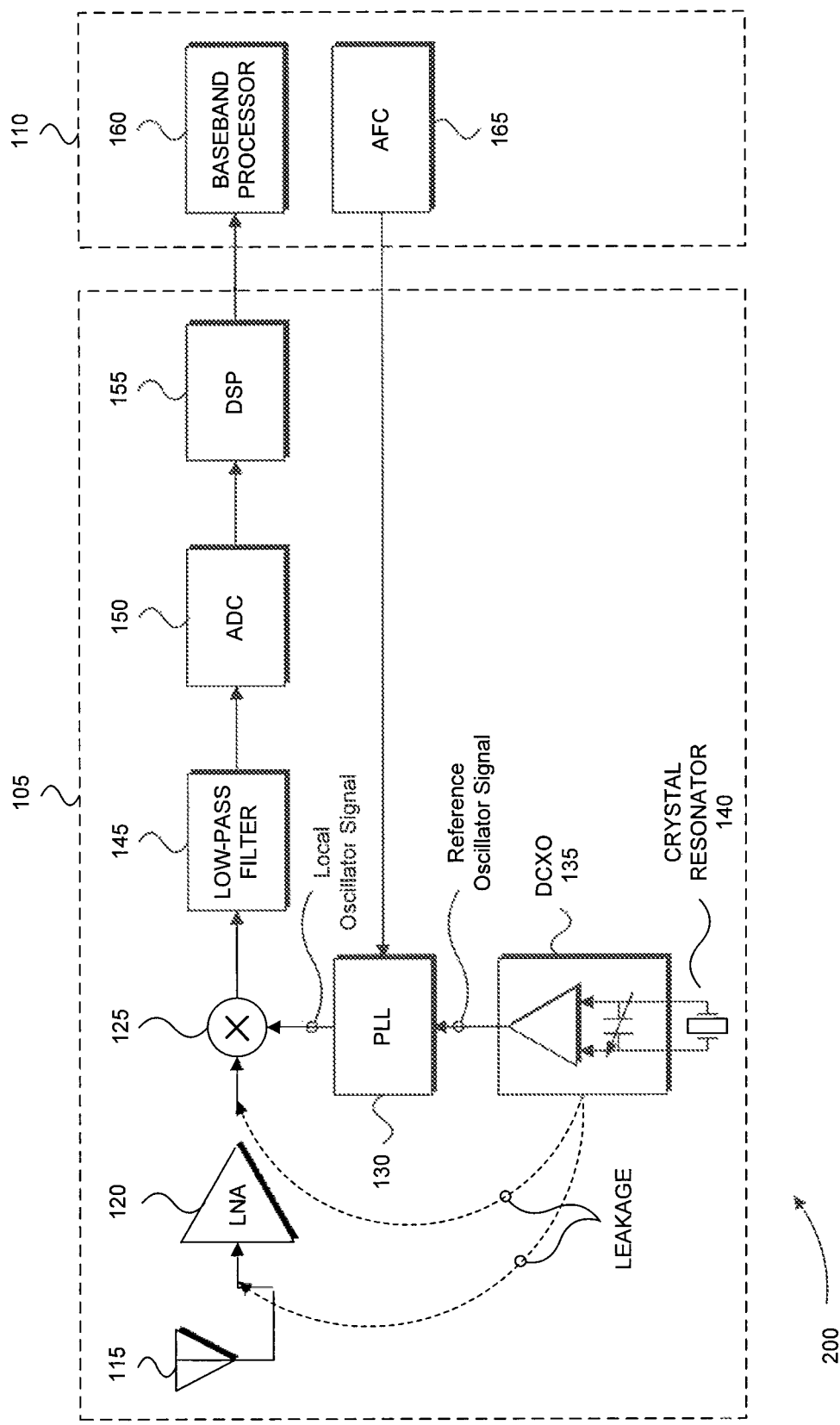
FIG. 3 illustrates potential leakage paths within a homodyne receiver, according to embodiments of the present invention.

Oscillator signals and their harmonics are a common source of spurious interference in RF receivers. FIG. 3 depicts several potential leakage paths for the reference oscillator signal, produced by DCXO 135 and crystal resonator 140, to leak into the input path of mixer 125 and cause spurious interference with the signal received by antenna 115. It is often very difficult to address every potential leakage path that may exist in an implementation of homodyne receiver 200. Therefore, the best approach to avoid interference from the reference oscillator signal is to devise a frequency plan in which the frequency of the reference oscillator signal and the frequencies of its stronger harmonics do not fall in the RF bands of interest of a signal received by antenna 115. However, such a frequency plan is often impractical, impossible, or undesirable to implement due to cost and/or design constraints. When frequency planning is unsuccessful, spurious interference can occur.

For example, in a second-generation (2G) cellular system, each downlink frequency band includes multiple carriers (or channels) whose frequencies are 0.2 MHz apart. One of the downlink frequency bands used in 2G cellular systems is the Extended GSM-900 band that spans the spectrum from 800-915 MHz and 925-965 MHz. Given the 0.2 MHz spacing between the carriers, it is clear that every integer number between 880 and 915 or between 925 and 960 is a frequency of a particular carrier in the Extended GSM-900 band. These numbers can easily fall on an integer multiple of a typical operating frequency for crystal resonator 140. For instance, assuming homodyne receiver 200 is configured to operate in a 2G GSM cellular system and DCXO 135 and crystal resonator 140 provide a reference oscillator with a fundamental frequency of 26 MHz, the $36^{th}$ harmonic of the reference oscillator signal will be at 936 MHz. This harmonic can leak into the input path of mixer 125 as illustrated in FIG. 3 and interfere with the carrier at 936 MHz in a 2G signal received by antenna 115.

In homodyne receiver 100, illustrated in FIG. 1, the $36^{th}$ harmonic of the reference oscillator signal provided by DCXO 135 and crystal resonator 140 would be frequency-locked to the carrier at 936 MHz because AFC controller 165 is adjusting the frequency of the reference oscillator signal to compensate for any frequency error between the carrier signal and the reference oscillator signal. Consequently, the $36^{th}$ harmonic of the reference oscillator signal at 936 MHz will appear at DC in the output of mixer 125 (assuming the carrier at 936 MHz is presently being demodulated) and can be eliminated using standard DC offset cancellation techniques.

In homodyne receiver 200, illustrated in FIGS. 2 and 3, however, the $36^{th}$ harmonic of the reference oscillator signal provided by DCXO 135 and crystal resonator 140 is no longer frequency-locked to the carrier at 936 MHz because AFC controller 165 is adjusting PLL 130 and not the frequency of the reference oscillator signal. In homodyne receiver 200, the reference oscillator signal produced by DCXO 135 and crystal resonator 140 is free-running. Consequently, the $36^{th}$ harmonic of the reference oscillator signal at 936 MHz can appear as a spur not at DC within the down-converted signal. Rather, any spur caused by the $36^{th}$ harmonic of the reference oscillator signal will appear at the estimated frequency error (or offset) determined by AFC 165 in the down-converted signal. Standard DC offset cancellation techniques therefore cannot be so readily implemented. Because the sensitivity requirement of a 2G GSM receiver is quiet stringent (around −110 dBm), these in-band spurs can severely degrade performance.

Figure 4:
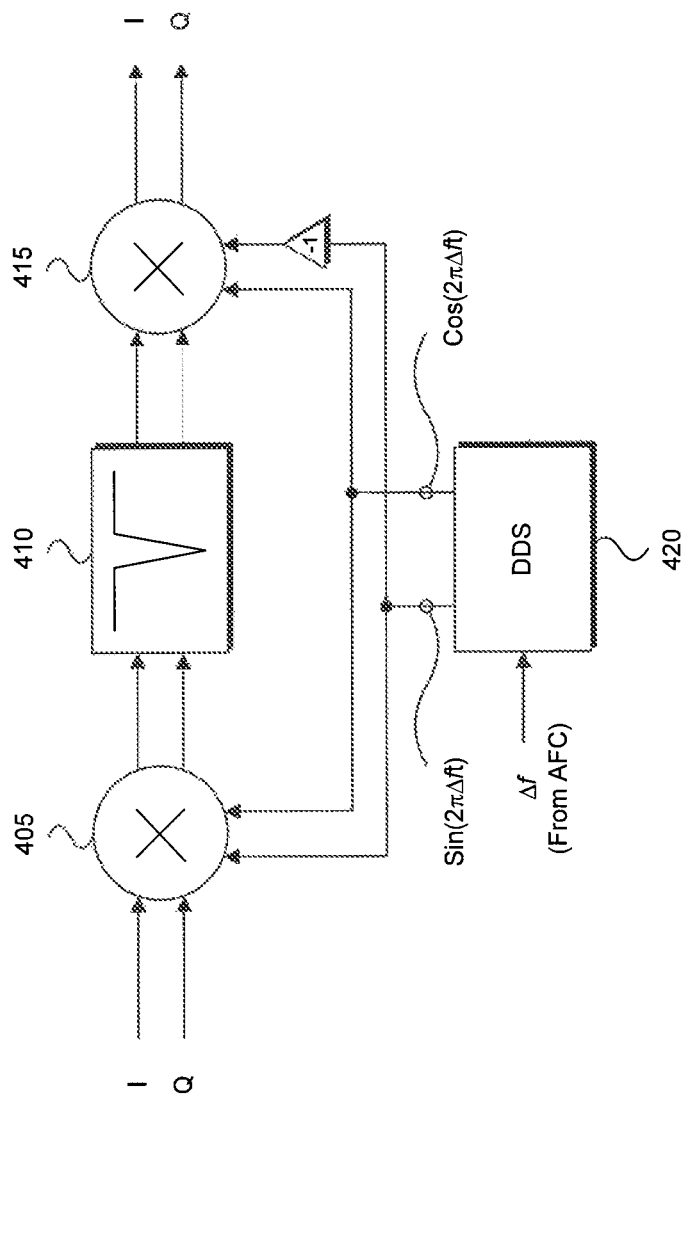
FIG. 4 illustrates a leakage canceler, according to embodiments of the present invention.

FIG. 4 illustrates a leakage canceler 400 configured to eliminate (or reduce) these in-band spurs, according to embodiments of the present invention. As illustrated in FIG. 4, leakage canceler 400 includes a complex mixer 405, a DC offset canceler 410, a complex mixer 415, and a direct digital synthesizer (DDS) 420. The operation of leakage canceler 400 is described below with continued reference to homodyne receiver 200 illustrated in FIGS. 2 and 3. It should be noted, however, that leakage canceler 400 is not limited to use in homodyne receiver 200 and can be used in any reasonable receiver that implements automatic frequency correction and has a free-running crystal. In one embodiment, leakage canceler 400 can be implemented in DSP 155 in receiver 200.

In general, leakage canceller 400 is configured to use the frequency error determined by AFC 165 (denoted by $\Delta f$ in FIG. 4) to compensate for a harmonic of the reference oscillator signal that couples to the input path of mixer 125 and falls in the band of the desired carrier at the output of mixer 125. More specifically, using complex mixer 405, leakage canceler 400 frequency-shifts the down-converted signal provided at the output of mixer 125 by the estimated frequency error determined by AFC 165 such that the unwanted spur is frequency shifted to baseband. Leakage canceler 400 then uses one or more conventional DC offset correction techniques, implemented by DC offset canceler 410, to reduce or eliminate the spur in the frequency-shifted signal. Once the spur has been reduced or eliminated, leakage canceler 400 re-positions the frequency-shifted signal, using mixer 415, back to (or at least near) its original frequency position.

In one embodiment, leakage canceler 400 is configured to receive the down-converted signal provided at the output of mixer 125 as a sequence of complex digital samples. The complex digital samples each have an in-phase component (I) and a quadrature component (Q). Complex mixer 425 mixes the complex digital samples of the down-converted signal with a complex oscillator signal produced by DDS 420 to frequency-shift the signal by the estimated frequency error determined by AFC 165.

In order to produce the complex oscillator signal, the estimated frequency error determined by AFC 165 is provided to DDS 420. In one embodiment, DDS 420 includes a numerically controlled oscillator (NCO), a sine/cosine look-up table, and a phase accumulator. The frequency of the complex oscillator signal produced by DDS 420 essentially depends on two variables: a frequency of a reference clock signal used by DDS 420 (not shown) and the estimated frequency error, which acts like a "tuning word" to DDS 420. The estimated frequency error provides the main input into the phase accumulator of DDS 420. The phase accumulator computes a phase angle or address for the sine/cosine look-up table, which outputs the digital amplitude corresponding to the sine/cosine of the phase angle. The value of the accumulator is incremented based on the magnitude of the estimated frequency error with each cycle of the reference clock signal. If the estimated frequency error is large, the phase accumulator will step quickly though the sine/cosine look-up table and thus generate a high frequency sine/cosine oscillator signal. On the other hand, if the estimated frequency error is small, the phase accumulator will take many more steps to step through the sine/cosine look-up table and therefore generate a comparatively lower frequency sine/cosine oscillator signal. Both complex mixers 405 and 415 can utilize the complex oscillator signal, produced by DDS 420, as illustrated in FIG. 4.

It should be noted that other implementations of DDS 420 are possible, as would be appreciated by one of ordinary skill in the art. For example, as opposed to using a straight sine/cosine look-up table, the Coordinate Rotation Digital Computer (CORDIC) algorithm can be used in the implementation of DDS 420.

3. Long-Term Drift

Referring to FIG. 2, after mixer 125 down-converts a desired carrier in the signal received by antenna 115, the down-converted signal is optionally low-pass filtered by low pass filter 145, converted to a digital signal by ADC 150, and processed by DSP 155. DSP 155 can include any additional logic to perform additional processing on the down-converted signal prior to being received by baseband processing section 110 and can include, for example, mechanism(s) for buffering the down-converted signal or mechanism(s) for performing clock domain crossing. DSP 155 typically provides samples of the down-converted signal to baseband processing section 110 at a rate that is a multiple of the symbol rate used to modulate the desired carrier. The symbol rate is the number of symbol changes made to the desired carrier per unit time and can be measured, for example, in symbols per second. Each symbol can represent or convey one or more bits of information.

Typically, it is desirable to operate ADC 150 and DSP 155 at the same rate at which the samples of the down-converted signal are provided to baseband processing section 110 (i.e., at the given rate that is a multiple of the symbol rate used to modulate the desired carrier). However, it is often impractical to operate ADC 150 and DSP 155 at this rate. More specifically, in order to operate ADC 150 and DSP 155 at the same rate at which the samples of the down-converted signal are provided to baseband processing section 110, a dedicated PLL for the ADC is generally required, which increases cost/area of the implementation of receiver 200 and introduces more phase noise into the system.

Moreover, since the jitter requirement in baseband processing section 110 is usually much less stringent than the jitter requirement of front-end 105 in many receivers, a low-cost ring oscillator PLL can be used to generate a clock for use by baseband processing section 110 that has a frequency which is a multiple of the symbol rate used to modulate the desired carrier. Because this clock is very jittery, it generally cannot be used by ADC 150.

Figure 5:
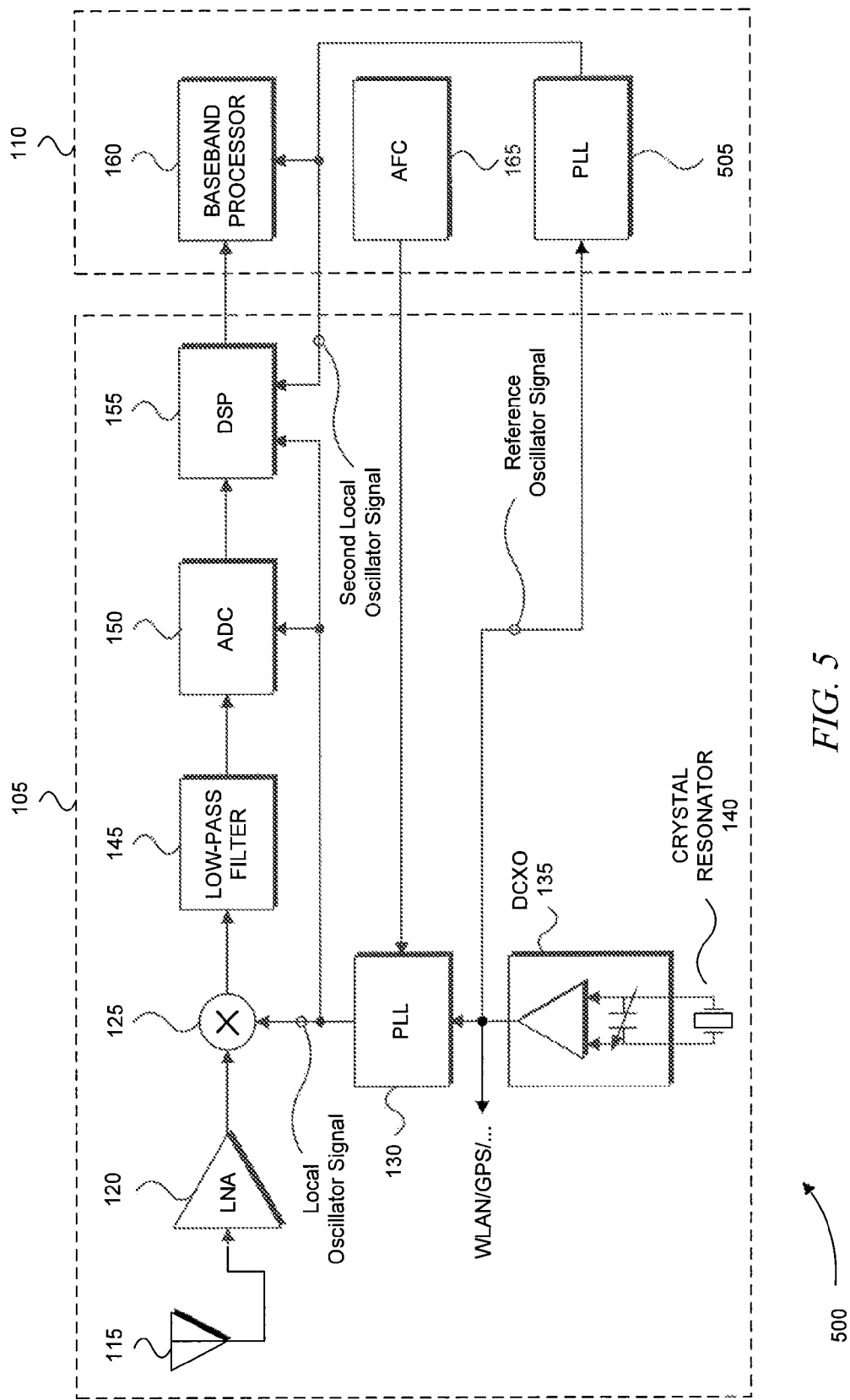
FIG. 5 illustrates a homodyue receiver, according to embodiments of the present invention.

Therefore, one potential implementation is illustrated in FIG. 5. FIG. 5 specifically illustrates a homodyne receiver 500 with nearly the same configuration as homodyne receiver 200, illustrated in FIG. 2. However, in homodyne receiver 500 an additional clocking structure is depicted for ADC 150, DSP 155, and baseband processor 160.

In the clocking structure depicted in FIG. 5, ADC 150 and a first portion of DSP 155 are clocked using the LO signal provided by PLL 130. A second portion of DSP 155 and baseband processor 160, on the other hand, are clocked using a second LO signal provided by PLL 505. In one embodiment, PLL 505 is implemented using a low-cost ring oscillator. PLL 505 uses the reference oscillator signal provided by DCXO 135 and free-running crystal resonator 140 to provide the second LO signal with a fundamental frequency that is a multiple of the symbol rate used to modulate the desired carrier in the signal received by antenna 115.

Figure 6:
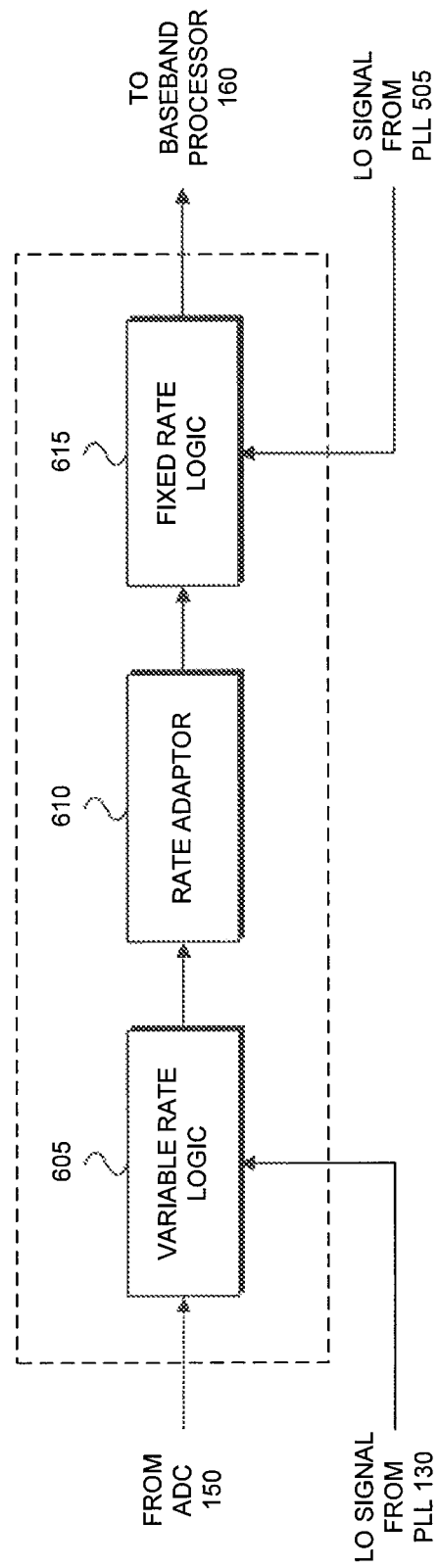
FIG. 6 illustrates a DSP with a rate adaptor, according to embodiments of the present invention.

In order to transfer the down-converted signal received by antenna 115 across the two clock domains (i.e., across the clock domain defined by the LO signal provided by PLL 130 and the clock domain defined by the LO signal provided by PLL 505), DSP 155 can include a rate adaptor 610 as illustrated in FIG. 6. Rate adaptor 610 sits between variable rate logic 605, clocked at a rate defined by the LO signal provided by PLL 130, and fixed rate logic 615, clocked at a rate defined by the LO signal provided by PLL 505. Rate adaptor 610 is configured to adapt the rate of the down-converted signal received from variable rate logic 605 to the rate of fixed rate logic 615 according to the following adaptor conversion ratio:

$$\frac{f_{IN}}{f_{OUT}} = \frac{M}{N} \quad (1)$$

where M and N are programmable integers and $f_{IN}$ and $f_{OUT}$ represent the input and output rate of rate adaptor 610, respectively.

Because PLL 505 is not frequency-locked to PLL 130, however (given that frequency correction is performed on PLL 130 by AFC 165), rate adaptor 610 cannot guarantee that the rate at which it provides the down-converted signal to fixed rate logic 615 is exactly the rate at which fixed rate logic 615 expects to receive the down-converted signal (i.e., at a rate equal to the rate defined by the LO signal provided by PLL 505). Any deviation in the output rate of rate adaptor 610 and the rate at which fixed rate logic 615 expects to receive the down-converted signal can result in long-term drift and, where a FIFO is implemented in the logic following rate adaptor 610, FIFO overflow/underflow. FIFO overflow/underflow indicates lost samples and can degrade the performance of receiver 500.

One solution for the long-term drift issue is that the estimated frequency error, provided by AFC 165 to PLL 130, can be used to compensate for any rate mismatch between the output rate of rate adaptor 610 and the expected rate at which fixed rate logic 615 expects to receive the down-converted signal. More specifically, and in one embodiment, the estimated frequency error, provided by AFC 165 to PLL 130, can be used to modify the M parameter and/or the N parameter of the adaptor conversion ratio of rate adaptor 610 to compensate for any rate mismatch. For example, using equation (1) above, the amount of correction can be calculated as:

$$\frac{f_{IN}}{f_{OUT} + \Delta f} = \frac{M + \Delta M}{N} \quad (2)$$

or $$\Delta M = -\frac{M}{1 + \frac{f_{OUT}}{\Delta f}} \quad (3)$$

where $\Delta f$ is the estimated frequency error and $\Delta M$ is the modification to be made to M in order to compensate for any rate mismatch that exists.

4. Conclusion

It should be noted that although features of the present invention were described above with respect to exemplary homodyne receivers, these features are equally applicable to superheterodyne receivers as would be appreciated by one of ordinary skill in the art.

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A receiver for using a reference oscillator signal provided by a crystal resonator to support multiple, different functionalities, the receiver comprising:
   a first phase-locked loop (PLL) configured to provide a first local oscillator signal based on the reference oscillator signal provided by the crystal resonator;
   a mixer configured to mix a received signal with the first local oscillator signal to provide a frequency-shifted signal;
   an automatic frequency controller (AFC) configured to estimate a frequency offset of the first local oscillator signal and adjust the first PLL to compensate for the frequency offset;
   an analog-to-digital converter (ADC) configured to obtain samples of the frequency-shifted signal, using the first local oscillator signal as a sampling clock, and convert the samples into a sequence of discrete values; and
   a rate adaptor configured to adapt a rate at which the sequence of discrete values is provided in accordance with a rate conversion ratio, wherein the rate conversion ratio is adjusted based on the frequency offset.

2. The receiver of claim 1, wherein the rate adaptor is configured to adapt the rate at which the sequence of discrete values, is provided from a first rate, determined based on the first local oscillator signal, to a second rate.

3. The receiver of claim 2, further comprising:
   a second PLL configured to provide a second local oscillator signal based on the reference oscillator signal provided by the crystal resonator, wherein the second rate is determined based on the second local oscillator signal.

4. The receiver of claim 2, wherein the second rate is a multiple of a symbol rate of the received signal.

5. The receiver of claim 1, wherein the rate conversion ratio is adjusted based on the frequency offset to correct for a rate mismatch in the rate adaptor.

6. The receiver of claim 1, wherein the rate adaptor is configured to adapt the rate after the sequence of discrete values has undergone processing.

7. The receiver of claim 1, wherein the AFC is configured to estimate the frequency offset using the frequency-shifted signal.

8. The receiver of claim 1, wherein the reference oscillator signal provided by the crystal resonator is not locked to a carrier frequency in the received signal.

9. The receiver of claim 1, wherein the multiple, different functionalities comprise a cellular communication functionality, a Global Position System (GPS) functionality, and a wireless local area networking (WLAN) functionality.

10. A method for using a reference oscillator signal provided by a crystal resonator to support multiple, different functionalities, the method comprising:
    providing a first local oscillator signal, using a first phase-locked loop (PLL), based on the reference oscillator signal provided by the crystal resonator;
    mixing a received signal with the first local oscillator signal to provide a frequency-shifted signal;
    estimating a frequency offset of the first local oscillator signal;
    adjusting the first PLL to compensate for the frequency offset;
    obtaining samples of the frequency-shifted signal, using the first local oscillator signal as a sampling clock;
    converting the samples into a sequence of discrete values; and
    adapting a rate at which the sequence of discrete values is provided in accordance with a rate conversion ratio, wherein the rate conversion ratio is adjusted based on the frequency offset.

11. The method of claim 10, wherein the adapting step further comprises:
    adapting the rate at which the sequence of discrete values is provided from a first rate, determined based on the first local oscillator signal, to a second rate.

12. The method of claim 11, further comprising:
    providing a second local oscillator signal, using a second PLL, based on the reference oscillator signal provided by the crystal resonator, wherein the second rate is determined based on the second local oscillator signal.

13. The method of claim 11, wherein the second rate is a multiple of a symbol rate of the received signal.

14. The method of claim 10, wherein the rate conversion ratio is adjusted based on the frequency offset to correct for a rate mismatch.

15. The method of claim 10, wherein the adapting step further comprises:
    adapting the rate after the first sequence of discrete values has undergone processing.

16. The method of claim 10, wherein the frequency offset is estimated using the frequency-shifted signal.

17. The method of claim 10, wherein the reference oscillator signal provided by the crystal resonator is not locked to a carrier frequency in the received signal.

18. The method of claim 10, wherein the multiple, different functionalities comprise a cellular communication functionality, a Global Position System (GPS) functionality, and a wireless local area networking (WLAN) functionality.

19. A receiver comprising:
    a mixer configured to mix a received signal with a local oscillator signal to provide a frequency-shifted signal;
    an automatic frequency controller (AFC) configured to estimate a frequency offset of the local oscillator signal and adjust a phase-locked loop (PLL) to compensate for the frequency offset;
    an analog-to-digital converter (ADC) configured to obtain samples of the frequency-shifted signal, using the local oscillator signal as a sampling clock, and convert the samples into a sequence of discrete values; and
    a rate adaptor configured to adapt a rate at which the sequence of discrete values is provided in accordance with a rate conversion ratio, wherein the rate conversion ratio is adjusted based on the frequency offset.

20. The receiver of claim 19, wherein the AFC is configured to estimate the frequency offset using the frequency-shifted signal.

* * * * *

UNITED STATES PATENT AND TRADEMARK OFFICE
CERTIFICATE OF CORRECTION

PATENT NO.      : 8,594,251 B2  
APPLICATION NO. : 13/166519  
DATED           : November 26, 2013  
INVENTOR(S)     : Farzad Etemadi It is certified that error appears in the above-identified patent and that said Letters Patent is hereby corrected as shown below:

At Title Page, Item (75) Inventors, please replace "Massoud Kahrizi" with --Masoud Kahrizi--.

Signed and Sealed this  
Tenth Day of June, 2014

Michelle K. Lee  
*Deputy Director of the United States Patent and Trademark Office*